United States Patent [19]

Mills

[11] 4,009,058
[45] Feb. 22, 1977

[54] METHOD OF FABRICATING LARGE AREA, HIGH VOLTAGE PIN PHOTODIODE DEVICES

[75] Inventor: Mark Philip Mills, Carleton Place, Canada

[73] Assignee: RCA Corporation, New York, N.Y.

[22] Filed: Jan. 26, 1976

[21] Appl. No.: 652,226

Related U.S. Application Data

[63] Continuation of Ser. No. 587,360, June 16, 1975, abandoned.

[52] U.S. Cl. .............................. 148/1.5; 148/186; 148/187; 148/188
[51] Int. Cl.² ...................................... H01L 21/265
[58] Field of Search ............ 148/1.5, 186, 187, 188

[56] References Cited
UNITED STATES PATENTS

| 3,798,081 | 3/1974 | Beyer | 148/188 |
| 3,821,038 | 6/1974 | Schwuttke | 148/186 |
| 3,895,965 | 7/1975 | MacRae et al. | 148/1.5 |

*Primary Examiner*—C. Lovell
*Assistant Examiner*—J. M. Davis
*Attorney, Agent, or Firm*—Glenn H. Bruestle; Daniel N. Calder; George E. Haas

[57] ABSTRACT

The body of a PIN photodiode is of a silicon semiconductor material. The PIN photodiode has a large area incident surface on which light impinges and is operated at high voltages. In the fabrication of a PIN photodiode, as described, a high concentration of N-type dopant is deposited on the body. It has been discovered that if a phosphorus silicate glass, as a source of N-type dopant, is in contact with a surface of the PIN photodiode body in a high temperature ambient and for an extended period of time, lattice damage on the surface of the silicon body results. These lattice defects are responsible for premature voltage breakdown in the device. In a first method of fabrication of PIN photodiode devices the phosphorus silicate glass is on the silicon surface for about 12 minutes after which it is removed and then any phosphorus atoms in the surface of the body are diffused into the body. In a second method of fabrication ion implantation is used to dope the body so that a surface of the body need not come in contact with phosphorus silicate glass.

12 Claims, 10 Drawing Figures

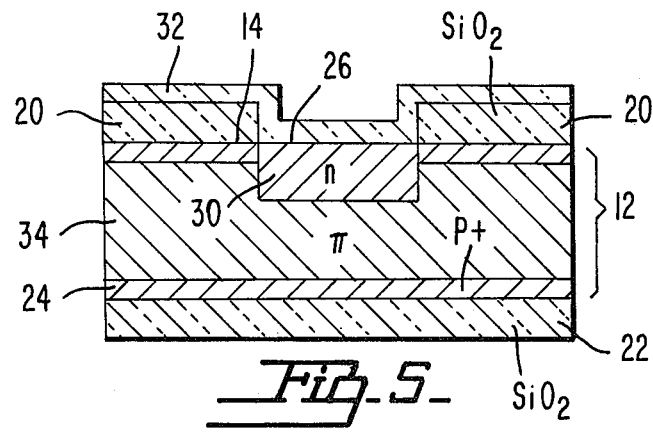
_Fig. 5_
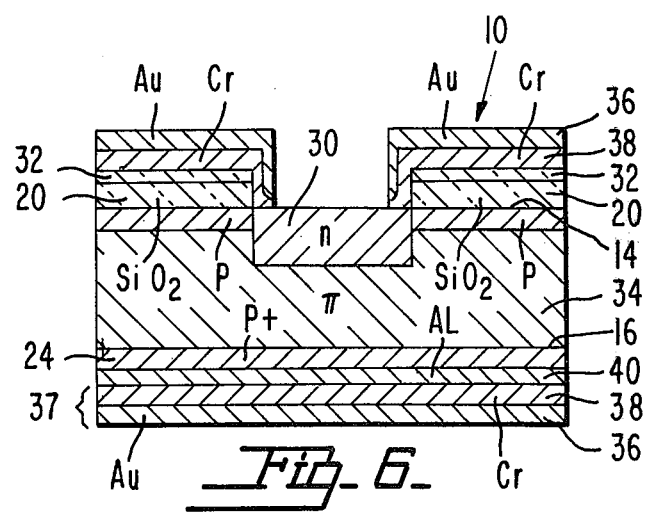
_Fig. 6_
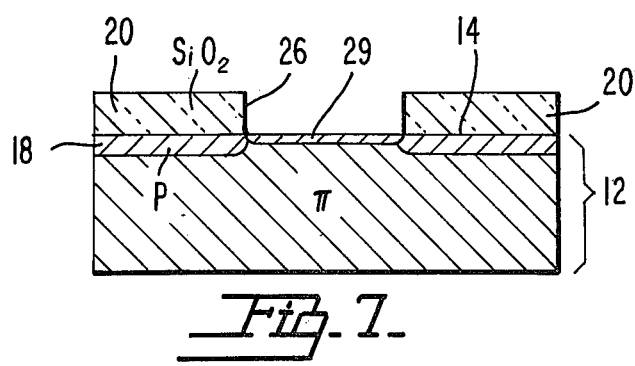
_Fig. 7_

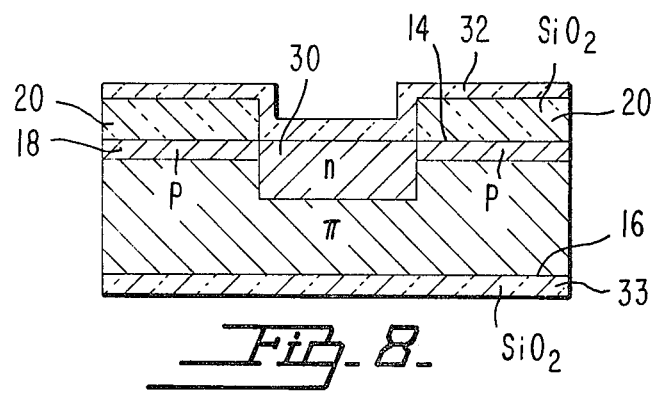
_Fig. 8._
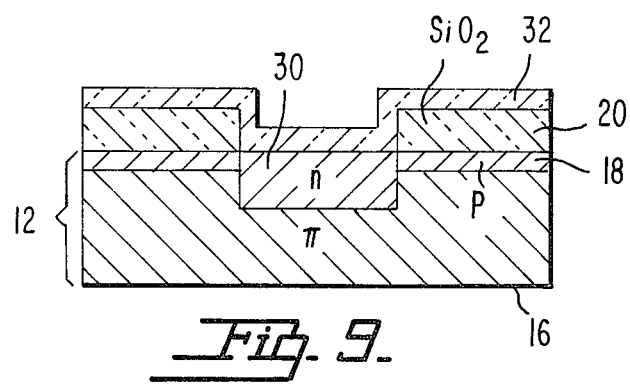
_Fig. 9._
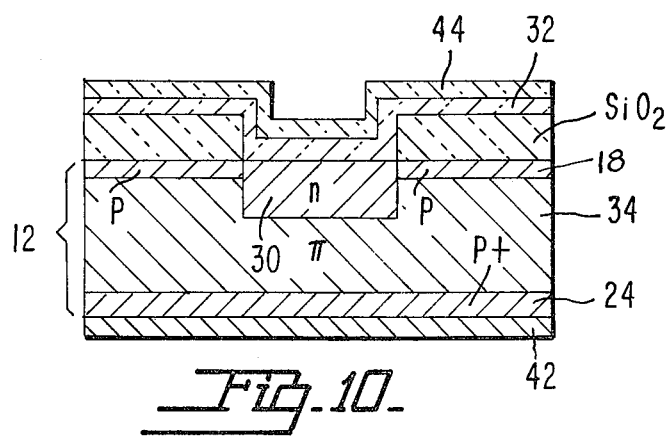
_Fig. 10._

METHOD OF FABRICATING LARGE AREA, HIGH VOLTAGE PIN PHOTODIODE DEVICES

This is a continuation, of application Ser. No. 587,360, filed June 16, 1975 now abandoned.

BACKGROUND OF THE INVENTION

This invention relates to a method of making a PIN photodiode device and more specifically to a method of making PIN photodiode devices which can operate at high voltages without premature breakdown.

Typically, a PIN photodiode device will comprise a silicon semiconductor body having an incident surface and a surface opposite the incident surface. The body includes a region of intrinsic semiconductor material of high resistivity i.e., 5,000 to 30,000 $\Omega$-cm, at a portion of the incident surface, a contacting region at the opposite surface and in contact with the intrinsic region, and an incident region in the intrinsic region at the remaining portion of the incident surface. Electrical contact of one polarity is made to the device at the contacting region and light impinges the device where the incident region is at the incident surface. The contacting region is of a conductivity type opposite to that of the incident region. The intrinsic region is of a very low dopant density, i.e., in the range of $5 \times 10^{11}$ to $5 \times 10^{13}$ atoms/cm$^3$, but is of a conductivity type opposite to that of the incident region. Thus, between the incident and intrinsic regions is a junction providing the device its diode effect.

In the operation of a PIN photodiode, a reverse bias voltage is placed across the body at the incident and contacting regions, so as to create a depletion region throughout the intrinsic region of the body. A depletion region is a region depleted of electrical carriers. The depletion region provided in the intrinsic region makes it sensitive to light absorption. Any light incident onto the PIN photodiode at the incident surface, traversing the intrinsic region and absorbed in the intrinsic region will generate an electron-hole pair. The generated electron and hole carriers are swept by the electric field of the depletion region to either the incident or contacting regions, depending on their conductivity type. It is this diffusion of the generated carriers across the junction of the incident and intrinsic regions which is detected as a current from the PIN photodiode device.

Either the incident or contacting region will be of an N-type conductivity and typically, the region of N-type conductivity is formed by depositing a phosphorus silicate glass (PSG) on a body of intrinsic semiconductor material in a deposition furnace; allowing the PSG to densify by leaving it in the furnace in an inert or forming gas ambient; and then diffusing the phosphorus atoms of the PSG into the body by leaving the PSG coated body in the furnace for an extended period of time. Typically, the deposition step takes from 5 to 15 minutes at a furnace temperature of 800° to 1,000° C; the densification step takes about 2 to 15 minutes at 800° to 1,000° C; and the diffusion step takes about 20 to 100 minutes at a furnace temperature of 800° to 1,000° C.

The reason diffusion must be from a source of N-type dopant which has been deposited on the intrinsic semiconductor body i.e., diffusion from solid to solid, and not by a gas diffusion technique, is that the dopant concentration to be deposited on a surface of the device and then diffused into either the incident or intrinsic region is high. High dopant diffusion, in the order of $10^{19}$ atoms/cm$^2$, can not be accomplished by gas to solid diffusion. The dopant concentration is high in both the contacting and incident regions in order to maintain these regions at a low resistivity, i.e., about 5 to 50 $\Omega$-cm. The low resistivity of the incident and intrinsic regions is needed so as to prevent the depletion region from entering either of these regions, thereby preventing any carriers from being injected into the intrinsic region from the contacting and incident regions. Also, the low resistivity and high carrier concentration results in a very short life time for any electrical carriers in the contacting or intrinsic regions, thus dark current leakage due to carrier injection from surface states from the contacting and incident regions are reduced.

If light of a long wavelength, i.e., 1 micron or longer, is to be detected by the PIN photodiode device and if the intrinsic region is of a semiconductor material such as silicon, then the intrinsic region will have to be thick, i.e., from 10 to 40 mils in thickness, to assure absorption of some of the incident light in the intrinsic region. It is well known in the photodiode field that silicon is not very sensitive to incident light of a long wavelength. Thus, the thicker the silicon intrinsic region the more light will be absorbed.

As a result of the requirement of a thick intrinsic region, the PIN photodiode must be reversed biased at a high voltage, typically in the range of 150 to 400 volts, to assure depletion of the entire intrinsic region. The thick intrinsic region and the high operating voltage of the PIN photodiode device accomplishes the two objectives of the device. These objectives are to detect as much of the light impinging the photodiode at the incident surface as possible, and for the photodiode to respond as fast as possible. The thick intrinsic region increases the quantum efficiency of the device by increasing the absorption of light, and the high operating voltage makes possible a fast response time in addition to assuring depletion of the entire intrinsic region.

If, in addition to the higher voltage requirement, the PIN photodiode device has an incident surface having a large area on which light impinges i.e., 0.5 to 3 cm$^2$, or if a photosensing device consists of a plurality of PIN photodiodes on a single body, there is an extremely high incidence of premature voltage breakdown. The cause of the high failure rate in PIN photodiode devices of a large incident surface area, operating at a high voltage has troubled those in the PIN photodiode art. The discovery of what is causing this problem and its solution would be most desirable in the PIN photodiode field.

SUMMARY OF THE INVENTION

A method of fabricating a PIN photodiode device having a body of intrinsic silicon semiconductor material with a resistivity in the range of 5,000 to 30,000 $\Omega$-cm, a large incident surface area and capable of operating in a reverse bias voltage in the range of 150 to 400 volts. The method includes doping the body with an N-type dopant source of a minimum dopant concentration of about $10^{19}$ atoms per square centimeter without causing lattice damage to a surface of the PIN photodiode body due to the growth of a phosphorus silicate glass N-type dopant source on the surface of the body.

BRIEF DESCRIPTION OF THE DRAWINGS

FIGS. 1 to 6 are cross-sectional views of the PIN photodiode device at steps in the first method of fabrication of the present invention.

FIGS. 7 to 10 are cross-sectional views of the PIN photodiode device at some of the steps in the second method of fabrication of the present invention.

DETAILED DESCRIPTION OF THE INVENTION

Figure 1:
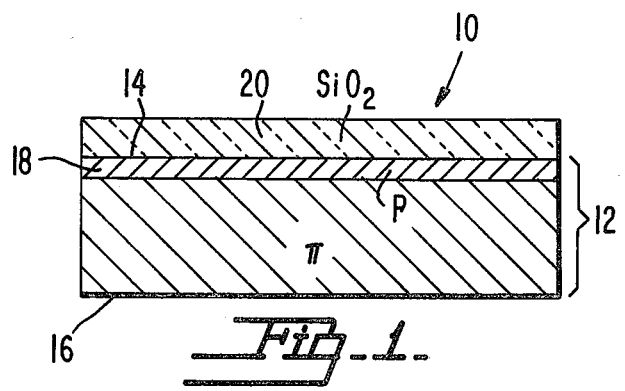

It is well known in the field of semiconductor devices that large dopant concentrations of phosphorus atoms, in the order of $10^{19}$ atoms/cm$^2$, diffused into silicon cause lattice damage, such as lattice dislocations and lattice strain, in the bulk silicon. As used throughout this specification the units, atoms/cm$^2$ refer to surface concentration. As the voltage is increased across a semiconductor device, having lattice damage due to phosphorus diffusion, the potential for current breakdown is also increased. That is to say, if this lattice damage occurs at a junction of the device, then at a high voltage the damaged semiconductor material may lose its insulating quality allowing a current avalanche to occur.

While this type of lattice damage to the silicon PIN photodiodes that has been described can be accounted for in determining breakdown voltage, it does not explain why PIN photodiodes having a large incident surface area, and operating at a high voltage have a high incidence of premature current breakdown.

I have discovered that this premature current breakdown is a result of lattice damage at the surface of the intrinsic semiconductor body caused by depositing phosphorus silicate glass (PSG) onto a surface of the body. The body is of $\pi$ type intrinsic silicon. By $\pi$ type it is meant that the intrinsic silicon is of a very low P type concentration, in the order of $5 \times 10^{11}$ to $5 \times 10^{13}$ atoms/cm$^3$. The PSG is deposited onto the intrinsic silicon body to form either a contacting or incident region of N-type conductivity. For purposes of explanation the incident region will be of N-type conductivity, while the contacting region is of P+ type conductivity. By P+ type is meant that the contacting region is of a high dopant density.

In the fabrication of PIN photodiodes, prior to my discovery the PSG was deposited on a surface of the intrinsic silicon body in a furnace, and the body was left in an inert ambient in the furnace for an extended period of time, so as to drive phosphorus atoms into the wafer to form an N-type incident region. Specifically, I have discovered that the longer the PSG is in contact with a surface of the intrinsic silicon body and the higher the growth temperature, the more lattice damage is done to the incident surface on which the PSG is grown. The junction between the intrinsic region and the incident region at the incident surface is referred to as the surface junction. In the PIN photodiode where the incident region at the incident surface is large in surface area, the surface junction will be of a large circumference. With the surface junction large in circumference, the probability of lattice damage at the surface junction is increased. Also, in a photosensing device which includes a plurality of PIN photodiodes in a single body, the total surface junction circumference, i.e. the sum of all the photodiodes surface junctions, will be large. Here again, the probability of lattice damage at a surface junction is increased. It is this lattice damage at the surface junction of the PIN photodiode device which at high voltages loses its insulating quality and results in a breakdown avalanche current.

In the following discussion two alternative methods are detailed for fabricating a PIN photodiode device in which the probability for lattice damage at the surface junction is greatly reduced.

Referring to FIG. 1 in the first method of the present invention for fabricating a PIN photodiode device 10, a body 12 of $\pi$-type intrinsic silicon is cleaned in a solution of trichloroethylene. The body 12 of $\pi$ intrinsic silicon is of a resistivity in the range of 5,000 to 30,000 $\pi$-cm and has an incident surface 14 and a surface 16 opposite the incident surface 14. The cleaned body 12 is placed in an ion implantation system, and a boron ion beam of about 70 KeV strikes the incident surface 14 of the body 12. At the incident surface 14, impinged by the boron beam, a thin P-type control region 18 is formed. The P-type control region 18 is of a doping density of about $10^{11}$ to $10^{12}$ atoms/cm$^2$.

The body 12 is then cleaned by placing it in a boiling solution of one part hydrogen peroxide, one part ammonium hydroxide and 5 parts water; rinsing the body 12; placing it in a boiling solution of one part hydrogen peroxide, one part hydrochloric acid and six parts water; and again rinsing off the body 12.

Next, the body 12 is oxidized by placing it in an oxidation furnace at about 1,000° C. for about one and a half to three hours in a steam ambient. A silicon dioxide layer forms on all the surfaces of the body 12. By placing a layer of Apiezon wax on the silicon dioxide layer which is on the incident surface 14, and then putting the body 12 in a solution of hydrofluoric acid, the silicon dioxide layer is etched from the body 12 except for what is designated as the first silicon dioxide layer 20, on the incident surface 14.

The P-type control region 18 serves a two function purpose. First, it prevents the depletion region from extending to the incident surface which would increase the possibility of carrier injection from the surface, and secondly, it prevents a surface conversion layer from forming at the incident surface 14. Surface conversion is a result of positive ion impurities in the first silicon dioxide layer 20 attracting negative ion impurities at the incident surface 14 of the body 12 thereby forming a negative layer at the incident surface 14. If a negative layer was formed at the incident surface 14 and it was contiguous to the N-type incident region to be formed at incident surface 14, there would be no surface junction at the incident surface 14. With the P-type control layer 18 at the incident surface 18 a negative layer is not formed. Only the P-type dopant concentration of the P-type control layer 18 is lowered as a result of negative ion migration to the incident surface 14 from the first silicon dioxide layer 20.

Figure 2:
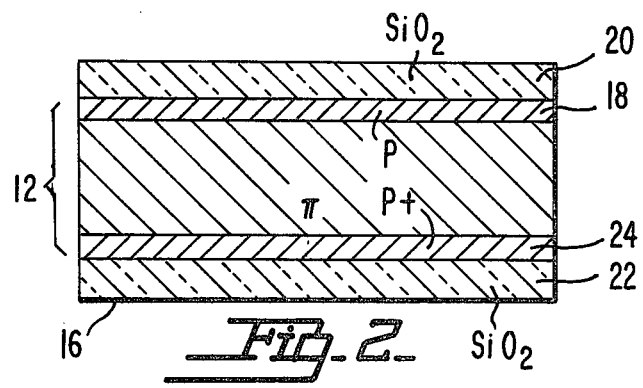

Referring to FIG. 2, a silicon dioxide layer 22 containing a high concentration of P-type dopant, i.e. $10^{16}$ to $10^{18}$ atoms/cm$^2$, is deposited onto the opposite surface 16 of the body 12 and the P-type dopant is diffused into the body 12, forming the contacting layer 24 of the PIN photodiode device 10. This is accomplished by placing the body 12 in a chemical vapor deposition system (CVD), where a mixture of the gases silane, oxygen, diborane and nitrogen is passed over the opposite surface 16 of the body 12 so as to deposit a P-type doped silicon dioxide layer 22 on the body 12. Boron from the diborane gas is the P-type dopant in the silicon dioxide layer 22. In order to diffuse the boron dopant into the body 12, the temperature of the CVD system is raised to about 1050° C. for about 30 minutes while the body 12 is in a nitrogen ambient.

Figure 3:
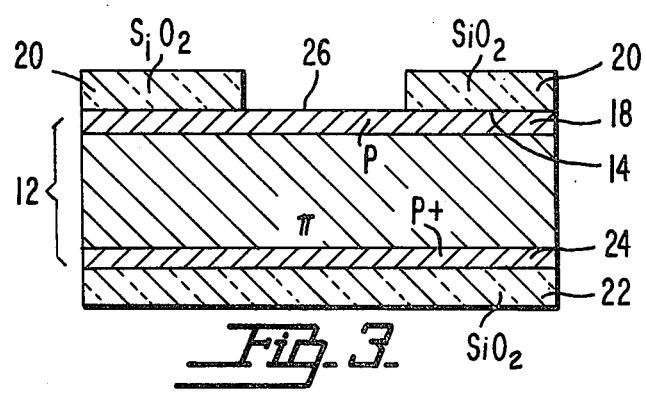

Next, referring to FIG. 3, by using state of the art photoresist techniques an opening 26 is made in the first silicon dioxide layer 20 at the location on the incident surface 14 where an incident region is to be later formed.

Again, the body 12 is cleaned as previously discussed, by placing it in various solutions of hydrogen peroxide, ammonium hydroxide, hydrochloric acid and water.

Figure 4:
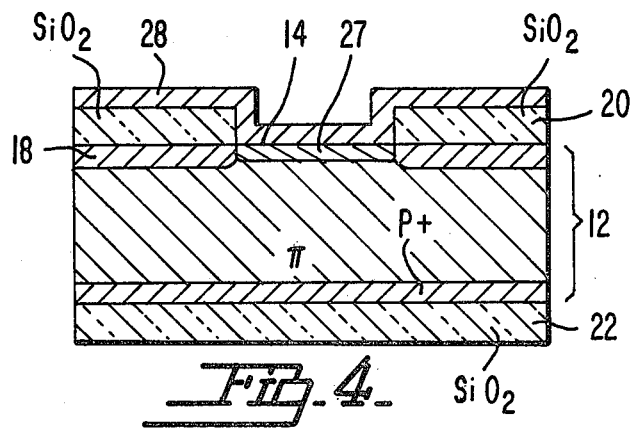

Referring to FIG. 4, a layer of phosphorus silicate glass 28 is grown on the first silicon dioxide layer 20 and the incident surface 14 at the opening 26. The body 12 is placed in a growth-diffusion furnace at 800° to 1,000° C. Oxygen at 60 to 90 cc/minute is bubbled through liquid phosphorus oxychloride ($POCL_3$), which is at room temperature. The oxygen functions as a transport gas, transporting the $POCL_3$ into the furnace and to the body 12. For about 6 minutes the $POCL_3$ and oxygen gases are in contact with and chemically react with the silicon of the first silicon dioxide layer 20 and the incident surface 14 at the opening 26. As a result of this chemical reaction the phosphorus silicate glass layer 28, of about 500A, is grown. The amount of silicon consumed in the reaction is very small. The furnace is then purged for 30 seconds with a nitrogen gas and then the phosphorus silicate glass layer 28 is densified by introducing into the furnace an ambient of forming or inert gas for about 6 minutes.

After, the phosphorus silicate glass layer 28 is densified it is removed by putting a wax layer on the P+ type doped silicon dioxide layer 22 and placing the body 12 in a buffered hydrofluoride solution. The buffered hydrofluoride solution dissolves the phosphorus silicate glass layer 28, but can't penetrate the wax layer. Thus, the time from when the phosphorus silicate glass layer 28 is first grown, to the time it is removed, is about 12 minutes. As previously discussed, the longer a phosphorus silicate glass is kept on a silicon surface, such as the incident surface 14, in a heated ambient the more lattice damage occurs at the surface. I have found that if the phosphorus silicate glass is on the incident surface 14 for no more than approximately 12 minutes under the conditions described, the lattice damage at the incident surface 14 is negligible.

In order for the growth of the phosphorus silicate glass layer 32 to commence, as a result of the chemical reaction between the $POCL_3$ and the silicon of body 12, a thin phosphorus source layer 27, i.e. about 200 A thick, is formed in the body 12 at the incident surface 14 in the area of opening 26. The exact composition of the phosphorus source layer 27 is not exactly known, but is something between silicon and phosphorus silicate glass. Also, as a result of the formation of the phosphorus source layer 27, the P-type control layer 18 in the area of the phosphorus source layer 27 is nullified.

After, removal of the phosphorus silicate glass layer 28 the body 12 is cleaned as previously described and is oxidized by placing the body 12 in a oxidation-diffusion furnace for about 20 to 100 minutes in an oxygen ambient at 900° to 1050° C. Referring to FIG. 5 during the oxidation, phosphorus from the thin phosphorus source layer 27 is diffused into the body 12 thereby forming the N-type incident region 30, and a second silicon dioxide layer 32 is deposited on the first silicon dioxide layer 20 and the incident surface 14 at the opening 26. After the oxidation and diffusion steps, what remains of the body 12 other than the P-type control region 18, incident region 30 and contacting region 24 is the intrinsic region 34.

Using photoresist techniques well known in the art, the P-type doped silicon dioxide layer 22 and the second silicon dioxide layer 32 on the incident surface 14 are removed.

Referring to FIG. 6, fabrication of the PIN photodiode device 10 is completed by forming an aluminum layer 40 and a multi-layer electrical contact 37. The multi-layer electrical contact 37 includes a chromium contacting layer 38 and a gold contacting layer 36 on the chromium contacting layer 38. Once again the body 12 is cleaned and then placed in a vacuum chamber of a vacuum deposition system. First the body 12 is baked for one hour at 100° C. after which approximately a 2,000A thick aluminum layer 40 is evaporated onto the opposite surface 16 of the contacting region 24. Next, the contact 37 is formed by evaporating the chromium contacting layers 38 onto both the aluminum layer 40, the second silicon dioxide layer 32 and the incident surface 14 at the incident region 30, and then the gold contacting layer 36 is evaporated onto the chromium contacting layer 38. Using photoresist techniques a portion of the multi-layer electrical contact 37 is removed from the incident surface 14 at the incident region 30 to allow light entrance into the PIN photodiode 10 at the incident region 30. A portion of the contact 37 must remain on the incident region 30 for electrical contact thereto. The aluminum layer 40 on the contacting region 24 reflects unabsorbed light back into the intrinsic region 34 for absorption on a second pass.

Some of the steps of a second method of the present invention for fabrication of a PIN photodiode 10 are depicted in the FIGS. 7 to 10. As described in the first method of fabrication, referring to FIG. 1, the body 12 of high resistivity intrinsic silicon is cleaned, a P-type control layer 18 is formed by ion implantation, the body 12 is oxidized and then the silicon dioxide on the opposite surface 16 is removed leaving the first silicon dioxide layer 20 on the incident surface 14.

Referring to FIG. 7, an opening 26 is formed in the first silicon dioxide layer 20 at the location on the incident surface 14 where the incident region is to be formed in the device 10. The opening 26 is formed by state of the art photoresist techniques.

Next, the body 12 is placed in an ion implantation system and an arsenic ion beam of a magnitude of 70 to 200 KeV is impinged onto the incident surface 14 at the opening 26. As a result of the ion implantation a thin dopant source layer 29 is formed about 700A in thickness at the incident surface 14 in the area of the opening 26, which is arsenic doped at a concentration of about $10^{16}$ atoms/$cm^2$.

Again, the body 12 is cleaned and then oxidized by placing the body 12 in a diffusion furnace in an oxygen ambient at 900° to 1050° C. for approximately one and a half to three hours. Referring to FIG. 8, the oxidation of the body 12 and the utilization of photoresist techniques results in the forming of a silicon dioxide layer 33 on the opposite surface 16 and a second silicon dioxide layer 32 on the incident surface 14 in the opening 26 and on the first silicon dioxide layer 20. Also, as a result of the body 12 being subjected to a temperature of 900° to 1050° C for one and a half to three hours during oxidation, the arsenic ions in the dopant source layer 29 are diffused into the body 12 thereby forming the N-type incident region 30.

Referring to FIG. 9, the silicon dioxide layer 33 on the opposite surface 16 is removed. This is accomplished by putting a wax layer on the second silicon dioxide layer 32, and then placing the body 12 in a solution of hydrofluoric acid.

Referring to FIG. 10, the p$^+$ type contacting region 24 of the PIN photodiode 10 is formed by depositing a layer of boron nitride glass 42 onto the opposite surface 16 of the body 12, and diffusing the boron atoms into the body 12. The body 12 is placed in a growth-diffusion furnace in which a boron nitride vapor, originating from a boron nitride wafer at 1050° C., is transported to the opposite surface 16 for about 30 minutes, for the growth of the boron nitride glass layer 42. During the 30 minutes of growth the boron atoms from the boron nitride glass layer 42 diffuse into the body 12 and form the p$^+$ type contacting region 24. The boron nitride glass is not grown onto the second silicon dioxide layer 32 since an oxidized wafer is placed flush against the second silicon dioxide layer 32 to prevent boron nitride glass growth. With the formation of the P-type control layer 18, the incident region 30, and the contacting region 24, the remaining portion of the body is intrinsic region 34.

After the diffusion of the boron atoms a mask is placed on the second silicon dioxide layer 32 and the boron nitride glass layer 42 is removed by placing the body 12 in a hydrofluoric acid solution. Then a passivation layer 44 is formed on the second silicon dioxide layer 32 by placing the body 12 in an oxidation furnace at a temperature in the range of 500° to 800° C. for ½ to 3 hours. In the oxidation furnace hydrochloric acid steam, HCL, is transported to the body 12. As a result of a chemical reaction between the hydrochloric acid steam and the silicon of the second silicon dioxide layer 32, a passivation layer 44 of HCL-silicon dioxide is deposited. The purpose of this step is to provide a stabilizing passivation layer 44 for gettering impurities at the surface junction of device 10.

To complete the fabrication of the PIN photodiode 10, photoresist techniques well known in the art are used to remove a portion of the second silicon dioxide layer 32 on the incident surface 16 and the passivation layer 44 on that portion of the second silicon dioxide layer 32 on incident surface 16. By the same steps discussed in the first method, referring to FIG. 6, the multi-layer electrical contacts 37 is formed on the device 10 along with the forming of the aluminum reflecting layer 40.

The advantage of the second method of the present invention is that at no time is a phosphorus silicate glass layer in direct contact with any surface of the silicon body 12. Thus there will be no lattice damage on the incident surface 14 of the body 12 due to a phosphorus silicate glass. In addition, since the N-type incident region 30 is doped by arsenic there is no lattice damage in the silicon body 12, principally in the intrinsic region 34, as a result of phosphorus diffusion. The nature of arsenic ions is not to damage bulk silicon as does phosphorus.

While in both the first and second methods of the present invention the light entered the PIN photodiode device 10 where the incident region 30 is at the incident surface 14, it is anticipated by the present invention that the PIN photodiode device 10 may be fabricated so that the light will instead enter the device at a portion of the opposite surface 16 at the contacting region 24.

The methods of the present invention provide PIN photodiode devices of large incident surface area and operating at high voltages, without the lattice defects which cause premature current breakdown.

I claim:
1. In a method of fabricating a PIN photodiode device having a body of intrinsic silicon semiconductor material with a resistivity in the range of 5,000 to 30,000 Ω-cm, a large incident surface area, and capable of operating in a reverse bias voltage in the range of 150 to 400 volts, the step of:
doping said body with an N-type dopant source of a minimum dopant concentration of about $10^{16}$ atoms per square centimeter without causing lattice damage to the surface of said PIN photodiode body.

2. The method of fabricating a PIN photodiode device in accordance with claim 1, wherein said doping is performed by:
growing a layer of phosphorus silicate glass on a surface of said body
removing said layer of phosphorus silicate glass from said body; and
diffusing into said body phosphorus which is in the surface of the body as a result of a chemical reaction of the phosphorus silicate glass with said body.

3. The method of fabricating a PIN photodiode device in accordance with claim 2 wherein the duration of time from when the layer of phosphorus silicate glass is first grown to the time it is removed is no more than about 12 minutes.

4. The method of fabricating a PIN photodiode device in accordance with claim 2 wherein the growing step is performed by bubbling oxygen gas, in the range of 60 to 90 cc/minute, through phosphorus oxychloride, said oxygen gas transporting the phosphorus oxychloride onto said body, which is in the range of 800° to 1000° C. for the growth of phosphorus silicate glass.

5. The method of fabricating a PIN photodiode device in accordance with claim 2 wherein the removing step is performed by placing said layer of phosphorus silicate glass in a buffered hydrofluoric acid solution.

6. The method of fabricating a PIN photodiode device in accordance with claim 2 wherein the diffusing step is performed by placing said body in a furnace for about 20 to 100 minutes in an oxygen ambient at 900° to 1050° C.

7. The method of fabricating a PIN photodiode device in accordance with claim 2, further comprising the step of:
densifying said layer of phosphorus silicate glass.

8. The method of fabricating a PIN photodiode device in accordance with claim 7 wherein the densifying step is performed by passing a forming gas over said layer of phosphorus silicate glass for about 6 minutes.

9. The method of fabricating a PIN photodiode device in accordance with claim 7 wherein the densifying step is performed by passing an inert gas over said layer of phosphorus silicate glass for about 6 minutes.

10. The method of fabricating a PIN photodiode device in accordance with claim 1 wherein said doping is performed by:
implanting N-type ions into a surface of said body.

11. The method of fabricating a PIN photodiode device in accordance with claim 10 wherein the implanting step is performed by impinging an ion beam in the range of 70 to 200 KeV onto a surface of said body.

12. The method of fabricating a PIN photodiode device in accordance with claim 11 wherein said N-type ions are arsenic.

* * * * *

UNITED STATES PATENT OFFICE
CERTIFICATE OF CORRECTION

PATENT NO. : 4,009,058

DATED : February 22, 1977

INVENTOR(S) : Mark P. Mills

It is certified that error appears in the above-identified patent and that said Letters Patent are hereby corrected as shown below:

After "BACKGROUND OF THE INVENTION" please insert the following paragraph:

-- The Government has rights in this invention pursuant to Contract No. DAAB07-74-C-0502 awarded by the Department of the Army. --

*Signed and Sealed this*

*Fourth* Day of *October 1977*

[SEAL]

Attest:

RUTH C. MASON
*Attesting Officer*

LUTRELLE F. PARKER
*Acting Commissioner of Patents and Trademarks*